Figure 1:
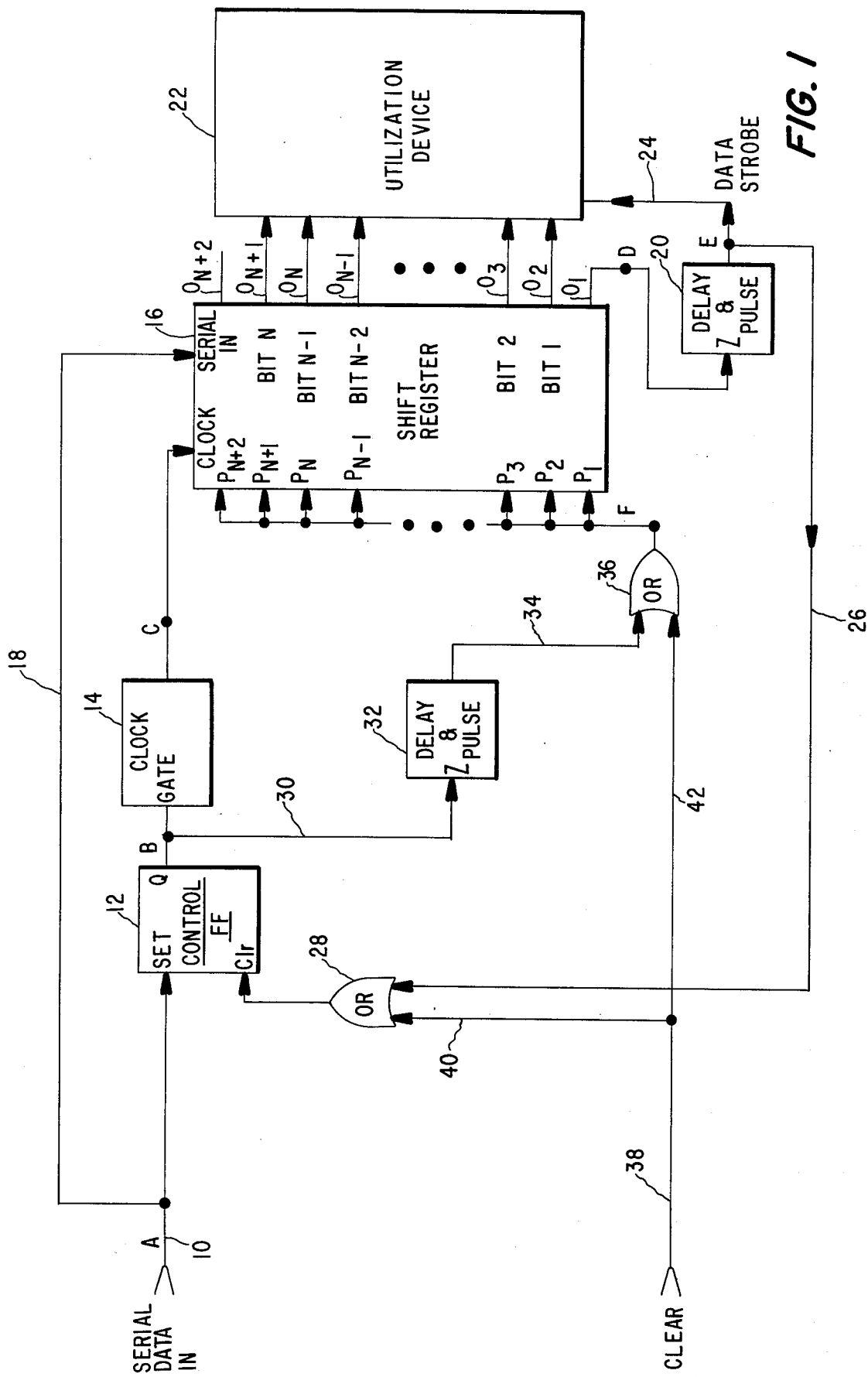

United States Patent [19]
Lippman

[11] 3,946,379
[45] Mar. 23, 1976

[54] SERIAL TO PARALLEL CONVERTER FOR DATA TRANSMISSION

[75] Inventor: Michael David Lippman, Hightstown, N.J.

[73] Assignee: RCA Corporation, New York, N.Y.

[22] Filed: May 31, 1974

[21] Appl. No.: 475,129

[52] U.S. Cl. .......................................... 340/347 DD
[51] Int. Cl.² .......................................... G06F 5/04
[58] Field of Search ............. 340/347 DD; 235/154; 178/26

[56] References Cited
UNITED STATES PATENTS

| | | | |
|---|---|---|---|
| 3,261,913 | 7/1966 | Reichert | 178/26 |
| 3,267,460 | 8/1966 | Merrell et al. | 340/347 |
| 3,310,626 | 3/1967 | Cassidy | 178/50 |
| 3,355,732 | 11/1967 | Lucas | 340/347 |
| 3,569,955 | 3/1971 | Maniere | 340/347 |

OTHER PUBLICATIONS

C. Williams, "Deserializer", IBM Technical Discl. Bulletin, Vol. 14, No. 2, July 1971, p. 653.
V. D. Dvornikov et al., "Parallel-to-Serial and Serial-to-Parallel Code Conv.", Instrum. & Exp. Tech. (U.S.A.), No. 1, (Jan.-Feb. 1970), pp. 101–103.

*Primary Examiner*—Charles D. Miller
*Attorney, Agent, or Firm*—Edward J. Norton; Carl V. Olson

[57] ABSTRACT

A circuit for converting into parallel output data a serial input data stream including characters of N data bits preceded by a start bit at one logic level and followed by at least one stop bit at another logic level. A shift register of N+2 stages in one embodiment has all of its stages preset to a logic level corresponding to the at least one stop bit. The circuit detects the presence of a start bit on the input line and serially clocks into the shift register the start bit, the N data bits and the at least one stop bit. The circuit responds to the detection of the start bit in a particular stage of the register to provide a strobing signal to indicate the availability of a complete character in the register for parallel shifting out. After the character is shifted out in parallel each stage of the shift register is reset to the initial condition.

1 Claim, 7 Drawing Figures

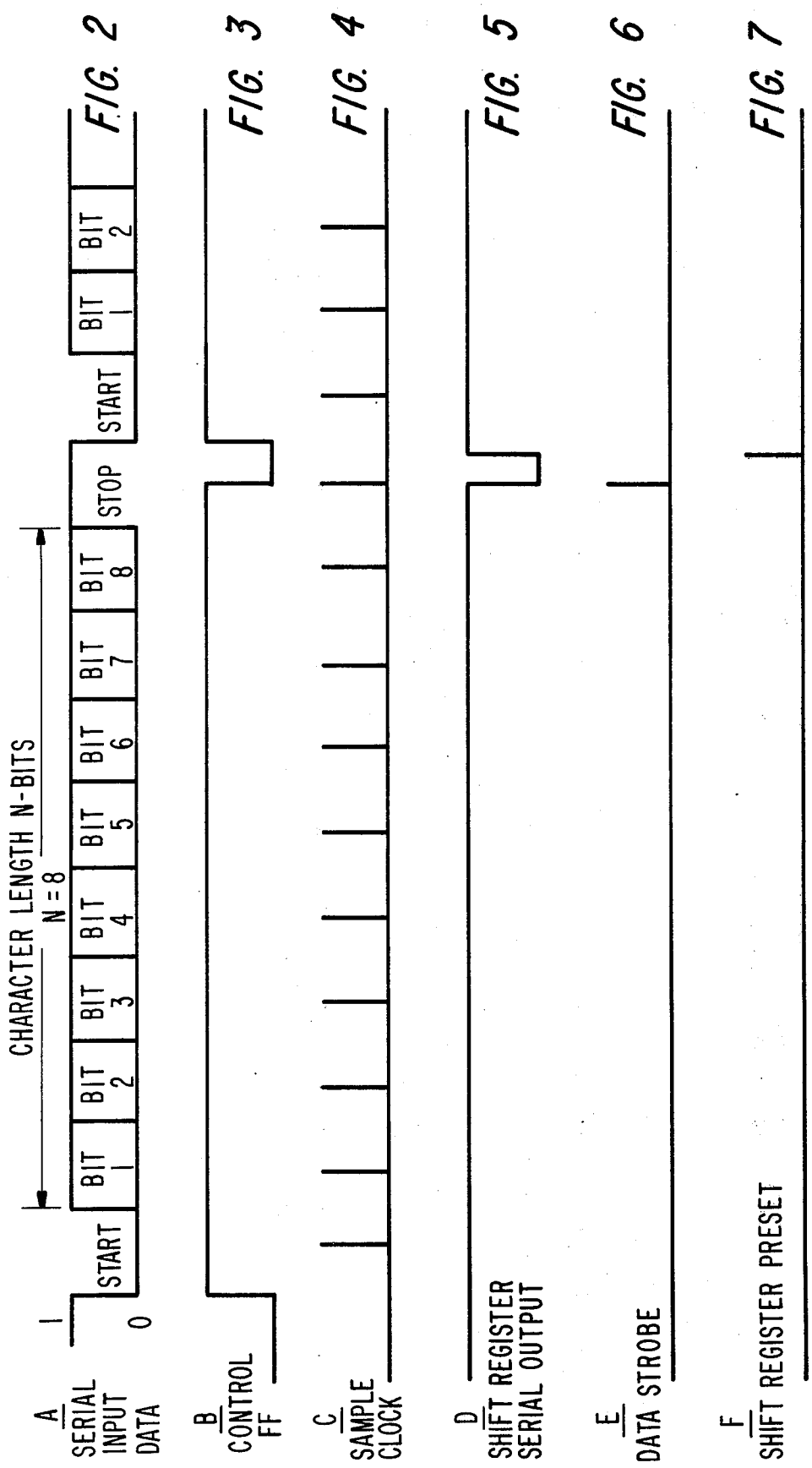

SERIAL TO PARALLEL CONVERTER FOR DATA TRANSMISSION

The present invention generally relates to serial-to-parallel converters and more specifically to self-clocking or framing serial-to-parallel converters.

It is the nature of most digital data communications channels to transmit data in a serial or bit-by-bit form. However, there are certain devices such as computers, teleprinters and other business machines which handle digital information as groups of bits, called characters or bytes. An example of this is the widely used USASCII code, wherein each group or character of seven bits represents one of 128 possible symbols, including aplhanumeric characters, special symbols and control characters. In order to work with such a code, incoming serial data from a communications channel must be converted to parallel form for use by certain types of data processing equipment.

A typical prior art approach to serial-to-parallel data conversion utilizes a counter in combination with a shift register. The first or start bit of the character coming in on the input serial data stream is detected and simultaneously the counter starts to count up while the data is shifted serially into the register. The counter is incremented once for each incoming data bit. When the count reaches the prescribed value, the data may be shifted out of the register in parallel and the counter is then reset to zero. The present invention provides a serial-to-parallel converter which eliminates the aforementioned counter while providing a circuit which will easily accommodate characters having different bit lengths with a minimum of complexity.

In accordance with the present invention, a circuit is provided for converting a serial input data stream into parallel output data. The serial input data is organized into characters comprising N bits of digital information. Each character is preceded by a start bit and followed by at least one stop bit. The start bit is at one logic level and the at least one stop bit is at another logic level. A shift register having N+X stages, where X equals the number of start and stop bits preceding and following, respectively, each character, is provided with each stage having an output terminal. The shift register is adapted for having each stage preset to a given initial condition. This initial condition is different from the logic level representing the start bit. A first means is provided for identifying the start bit in the input data stream. A second means responds to the first means and serially clocks the start bit, the N bits of a character and the at least one stop bit into the shift register. A third means which is coupled to a particular stage of the shift register responds to the transition from the initial condition to the logic level representing the start bit in the particular stage and provides a strobing signal to indicate the availability of N bits representing a complete character at the output terminals of the shift register.

The present invention is particularly useful in asynchronous digital data transmission systems. In asynchronous data transmission a group of bits corresponding to a character are generally separated from the preceding and following characters by framing bits. A commonly found organization of data in asynchronous transmission systems is, in the order of occurrence, a start bit, usually a logical zero; the data bits comprising the character; and one or more stop bits usually a logical one. In addition, when no information is being sent, the input data line is held at the logical one level. Thus, the beginning of a new character in such a system is always indicated by a logic one to zero transition. That is, the transition between a stop bit and a start bit or an idle line and a start bit is always a one to zero transition and indicates that a new character is to follow.

IN THE DRAWING

FIG. 1 is a diagram showing a preferred embodiment of the present invention; and FIGS. 2–7 are timing diagrams associated with FIG. 1 and helpful in explaining the preferred embodiment of the invention shown therein.

Referring now to FIG. 1, a serial stream of input digital data is applied to the serial-to-parallel data converter circuit on line 10. The organization of the serial data coming in on line 10 and appearing at point A is shown in FIG. 2. The incoming data stream comprises: a character which is eight bits in length; a start bit at logic 0 preceding the character; and a stop bit at logic 1 following the character. After the stop bit associated with one character occurs, the start bit of the next succeeding character occurs. Every stop bit in the data stream is a logic 1 and every start bit in the data stream is a logic 0.

Returning to FIG. 1, the input data stream on line 10 is coupled to the set input terminal of a control flip-flop 12. Flip-flop 12 is, generically, an R-S type flip-flop. That is, when the set input terminal sees a certain condition, in this case a 1 to 0 transition, the Q output terminal goes high and will remain high for all levels presented to the set input terminal. The Q output terminal of R-S type flip-flop 12 goes low only upon the application of a clear or reset pulse applied to the clear input terminal thereof. Flip-flop 12 looks for and detects the 1 to 0 transition between the stop bit of one character and the start bit of the next succeeding character. The waveform appearing at point B which is at the Q output of flip-flop 12 is shown in FIG. 3. The 1 to 0 transition in the waveform at point A causes the control flip-flop 12 to be set during the entire length of the character which follows this transition.

As long as the Q output of flip-flop 12 is high, or at logic 1, a signal is applied to the input terminal of a clocking device 14. Clocking device 14 is a gated clock, in that a clock signal will be provided at the output terminal thereof, connected to point C, for as long as the signal at point B is high. The response of clocking device 14 to a 0 to 1 transition at point B is such that the first and all subsequent clock pulses are positioned at or near the center of each start, data or stop bit. The waveform of the clocking pulses at point C is shown in FIG. 4. The waveform of FIG. 4 is more appropriately called a sampling clock since these pulses are much shorter in duration than the duration of a data, stop or start bit and the clock pulses occur within the time duration of the aforementioned bits. The clock pulses at point C are applied to the clock input terminal of shift register 16.

Shift register 16 comprises N+2 stages, where N is equal to the number of bits which form a character. Thus in the embodiment of FIG. 1 the shift register 16 comprises 10 stages. It will be understood from what follows that the number of stages used in shift register 16 is determined by the total number of bits in the character being processed and the number of bits comprising the framing information. Thus, more or less bits in the character or more or less bits used for framing, in this case the stop-start bits, will determine the length of shift register 16.

Shift register 16 is also provided with, in this case, N+2 preset input terminals which are electrically connected together at point F. This arrangement is provided so that all stages of register 16 may be preset to a logic 1 state in response to a logic 1 level applied at point F. Thus, the application of a 1 level at point F causes a 1 level to appear at terminals P1-PN+2 and each stage of register 16 goes to a logic 1 level. Shift register 16 has N+2 output terminals connected to output lines O1 to ON+2 respectively. The initial condition of register 16, i.e. prior to loading data, is always, in this embodiment, a 1 in each stage thereof.

In response to the clock pulses at point C, the sampled input data is clocked into shift register 16 via line 18 and the serial input terminal of register 16. As the input data is shifted through the N+2 stages of register 16, the extreme stage coupled to output line O1 sees a constant 1 level as the preset 1's are serially unloaded onto line O1. The waveform at point D which is on line O1, is shown in FIG. 5. In FIG. 5 it will be seen that the waveform at point D stays high as the input data is shifted into the register 16 and the initial condition 1's are shifted out at point D until the start bit propagates through the register 16 and is located in the stage to which line O1 is coupled. At this time the stop bit is in the first stage, the character is in the second through ninth stage, and the start bit is in the tenth stage of register 16.

When the last stage of register 16 sees the transition from the initial 1 condition to the 0 condition of the start bit, a delay and pulse circuit 20 which is connected to line O1 is activated. The delay and pulse circuit 20 may typically comprise two cascaded one-shot multivibrators which provide an output pulse at point E in response to the transition from 1 to 0 in the last stage of register 16. The pulse provided at point E, which may be termed a data strobe, is an indication that a full character is available in register 16 for parallel output of lines O2 to ON+1.

Lines O2 to ON+1, that is the lines passing the full character, are connected to a utilization device 22. Device 22 may take many forms such as a computer, a teletype or even buffering equipment preceding a computer, teletype or other equipment. The pulse appearing at point E is coupled to device 22 via line 24. This data strobe pulse may be used to merely indicate to the device 22 that a character is ready for parallel processing or may be used in some type of gating arrangement.

In addition, the pulse appearing at point E is coupled via line 26 to one input terminal of OR gate 28. The output terminal of OR gate 28 is connected to the clear input terminal of control flip-flop 12. Upon the appearance of a pulse at point E, control flip-flop 12 is cleared and the signal at point B goes low. Clocking device 14 is gated off by the low level at point B and no additional bits are clocked into register 16 at this time.

The signal appearing at point B is coupled via line 30 to a second delay and pulse circuit 32. Circuit 32 may also comprise two one-shot multivibrators in cascade. Delay and pulse circuit 32 responds to the transition from 1 to 0 in waveform B to generate a pulse which is delayed in time with respect to that transition. The pulse from circuit 32 is coupled via line 34 to one input terminal of OR gate 36. The waveform appearing at the output terminal of OR gate 36, that is point F, is provided to the preset input terminals P1-PN+2 of register 16. Thus, the pulse appearing at point F and shown in FIG. 7 is used to reset register 16 back to its initial condition of a logical one level in each stage. It will be noted that the reset pulse at point F is applied after the data strobe at point E. This is a result of the operation of circuit 32 and helps to insure that the parallel data is read out of the register 16 before the register gets reset. However, this reset pulse at point F must occur before the beginning of the next start bit. Thus, it will be seen that the cycle of converting serial input data into parallel output data includes an automatic reset phase.

In addition to the circuitry previously described, there is also circuitry provided in FIG. 1 for setting the initial conditions before the input data arrives. A source of clear signals (not shown) is provided on line 38 and is coupled to the other input terminal of gate 28 and the other input terminal of gate 36 via lines 40 and 42 respectively. One may selectively apply a clear pulse to line 38 at any time. The pulse applied to line 38 will insure that clocking device 14 is gated off via control flip-flop 12 and at the same time will insure resetting of the 1 level initial condition in register 16 via OR gate 36 and the preset input terminals P1-PN+2 connected to point F.

To recap the operation of the circuit of FIG. 1, the register 16 is set to an initial condition of all 1's in each stage. The transition between a stop and start bit gates on the clocking device 14 and the start bit, the N bits of the character and the stop bit are serially clocked into register 16. The output line O1 sees all 1's coming out of the associated register stage until the start bit reaches that stage. In response to this transition from 1 to 0 a delayed data strobe pulse is generated which indicates that the full character is ready for processing. In response to the data strobe pulse the clocking device 14 is gated off and shortly thereafter all stages of the register are returned to a 1 level condition. The circuit is now ready to respond to the next stop-start bit transition on the incoming data line 10.

Thus, the present invention describes a serial-to-parallel data converter which eliminates the use of a counter and therefore provides a simpler arrangement than the typical prior art circuits. Another important advantage is the ease with which different character lengths, that is characters with different values of N, can be handled. For example, if a character length of six bits is to be handled, i.e. N=6, point D is simply moved either mechanically or electronically onto line O3. Now eight stages of register 16 would be used with the start bit propagating to the stage coupled to line O3, the six bits of the character located in the stages coupled to lines O4 – O9, and the stop bit located in the stage coupled to line O10 in FIG. 1 when register 16 is full. The operation previously described for N=8 is carried out in exactly the same way when N=6 is used. Thus, it is a relatively simple matter to accommodate any number of character bits as long as the register, such as 16, has enough stages to accommodate all the character and framing bits.

What is claimed is:

1. A circuit for converting a serial input data stream into blocks of parallel output data, said serial input data stream comprising a plurality of characters, each character comprising N bits of digital information preceded by a start bit represented by one voltage level and followed by at least one stop bit represented by another voltage level, said circuit comprising:

a shift register having a clock input terminal, and having a data input terminal receptive to said serial input data stream, and comprising N+X stages, where X equals the number of start and stop bits preceding and following, respectively, each character, each stage having an output terminal, said shift register being adapted through a reset terminal for having each of said N+X stages preset to a particular initial condition, said initial condition being represented by said other voltage level;

a set-reset flip-flop circuit having a set input terminal receptive to said serial input data stream and being responsive to the transition between said other voltage level and said one voltage level representing a start bit in said input data stream for providing a gating signal so long as the flip-flop is in its "set" state;

clocking means having an output terminal coupled to the clock input terminal of said shift register and responsive to the presence of said gating signal for serially clocking in a start bit, N bits representing a character and said at least one stop bit into said shift register;

pulse means coupled to the output terminal of a particular stage of said shift register and responsive to the transition from the initial condition voltage level to the voltage level representing said start bit in said particular stage for providing a strobing signal indicating the availability of a complete character at N output terminals of said shift register;

means coupling said strobing signal to the reset input of said flip-flop to thereby discontinue said gating signal and the output of said clocking means; and delay means responsive to termination of said gating signal for coupling a signal to the reset input terminal of said shift register to restore the shift register to said initial condition.

* * * * *